US009559487B2

(12) United States Patent
Doerr

(10) Patent No.: US 9,559,487 B2
(45) Date of Patent: Jan. 31, 2017

(54) INTEGRATED HIGH-POWER TUNABLE LASER WITH ADJUSTABLE OUTPUTS

(71) Applicant: Acacia Communications, Inc., Maynard, MA (US)

(72) Inventor: Christopher Doerr, Middleton, NJ (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 14/797,018

(22) Filed: Jul. 10, 2015

(65) Prior Publication Data

US 2016/0013609 A1    Jan. 14, 2016

Related U.S. Application Data

(60) Provisional application No. 62/023,483, filed on Jul. 11, 2014.

(51) Int. Cl.
| | |
|---|---|
| *H01S 3/10* | (2006.01) |
| *H01S 5/00* | (2006.01) |
| *H01S 5/32* | (2006.01) |
| *H01S 5/323* | (2006.01) |
| *H01S 5/0683* | (2006.01) |
| *H01S 5/40* | (2006.01) |
| *H01S 5/026* | (2006.01) |

(Continued)

(52) U.S. Cl.
CPC ......... *H01S 3/10015* (2013.01); *H01S 5/0683* (2013.01); *H01S 5/1025* (2013.01); *H01S 5/3224* (2013.01); *H01S 5/3235* (2013.01); *H01S 5/4062* (2013.01); *H01S 5/0261* (2013.01); *H01S 5/0687* (2013.01); *H01S 5/06246* (2013.01); *H01S 5/101* (2013.01); *H01S 5/1014* (2013.01); *H01S 5/1032* (2013.01)

(58) Field of Classification Search
CPC .. H01S 3/10015; H01S 5/3224; H01S 5/4062; H01S 5/0683; H01S 5/3235; H01S 5/1025; H01S 5/1032; H01S 5/101; H01S 5/06246; H01S 5/1014; H01S 5/0261; H01S 5/0687
See application file for complete search history.

(56) References Cited

U.S. PATENT DOCUMENTS

| | | | |
|---|---|---|---|
| 6,240,118 B1 | 5/2001 | Doerr et al. | |
| 6,434,175 B1 * | 8/2002 | Zah ........................ | H01S 3/2383 372/20 |

(Continued)

FOREIGN PATENT DOCUMENTS

WO    WO 2014/021781 A1    2/2014

OTHER PUBLICATIONS

International Search Report and Written Opinion mailed Oct. 28, 2015 for Application No. PCT/US2015/039949.

*Primary Examiner* — Yuanda Zhang
(74) *Attorney, Agent, or Firm* — Wolf, Greenfield & Sacks, P.C.

(57) ABSTRACT

A tunable laser that includes an array of parallel optical amplifiers is described. The laser may also include an intracavity N×M coupler that couples power between a cavity mirror and the array of parallel optical amplifiers. Phase adjusters in optical paths between the N×M coupler and the optical amplifiers can be used to adjust an amount of power output from M−1 ports of the N×M coupler. A tunable wavelength filter is incorporated in the laser cavity to select a lasing wavelength.

21 Claims, 7 Drawing Sheets

(51) Int. Cl.
    *H01S 5/0687*    (2006.01)
    *H01S 5/10*      (2006.01)
    *H01S 5/062*     (2006.01)

(56) References Cited

U.S. PATENT DOCUMENTS

| | | | |
|---|---|---|---|
| 2005/0002424 A1* | 1/2005 | Bernasconi | H04B 10/506 |
| | | | 372/20 |
| 2006/0182441 A1* | 8/2006 | Kish, Jr. | B82Y 20/00 |
| | | | 398/33 |
| 2011/0103415 A1* | 5/2011 | Rasras | B29D 11/00663 |
| | | | 372/29.011 |
| 2011/0235659 A1 | 9/2011 | Fukuda | |
| 2013/0223844 A1 | 8/2013 | Hwang | |
| 2014/0133511 A1 | 5/2014 | Tanaka | |
| 2014/0185980 A1 | 7/2014 | Lei et al. | |

\* cited by examiner

US 9,559,487 B2

INTEGRATED HIGH-POWER TUNABLE LASER WITH ADJUSTABLE OUTPUTS

RELATED APPLICATIONS

The present application claims the benefit under 35 U.S.C. §119(e) of U.S. Provisional Patent Application Ser. No. 62/023,483 entitled "INTEGRATED HIGH-POWER TUNABLE LASER WITH ADJUSTABLE OUTPUTS," filed Jul. 11, 2014, which is incorporated herein by reference in its entirety.

BACKGROUND

Field

The present application relates to tunable lasers, optical amplifiers, and to optical communication systems.

Related Art

Tunable lasers conventionally consist of a tunable wavelength filter and a single optical gain medium inside a resonant laser cavity. A depiction of a conventional tunable laser 100 is shown in FIG. 1. The laser cavity may include an intracavity beam 102 that reflects between a high-reflector end-mirror 105 and partially-transmitting mirror 140 (referred to as an "output coupler"). The intracavity beam passes through the gain medium 110 and tunable wavelength filter 130 as it circulates between the end-mirror and output coupler.

Such lasers normally have only one output beam 104, which emits from the output coupler 140. For example, the output coupler may transmit about 10% of the optical power in the intracavity beam 102 outside the laser cavity to form the output beam 104. Conventionally, the amount of power coupled outside the laser cavity cannot be adjusted while the laser is operating. Instead, the laser must be shut off, and a different output coupler 130 installed and aligned.

Because a conventional laser contains one gain medium, the laser power is limited by the saturation power of the gain medium 130. Once the saturation power level is reached in the gain medium, no further substantial increase in output power from the laser cavity can be achieved. To increase available laser power, a conventional technique passes the output beam 104 through an optical amplifier located downstream of the laser 100.

BRIEF SUMMARY

The present technology relates to tunable lasers, high-power lasers, and optical amplifiers. A plurality of optical amplifiers may be integrated in parallel into a laser cavity. Additionally, the laser may include a tunable filter and provide a plurality of power output ports, where power from each port is adjustable. According to some embodiments, a laser having a laser cavity may comprise a reflector at a first end of the laser cavity and an intracavity N×M coupler arranged to receive light from the reflector at a first port and distribute the light to N output ports. The laser may further include Q optical amplifiers arranged to amplify light from at least some of the N output ports and at least one reflector arranged to reflect the amplified light back to the N×M coupler. The number of optical amplifiers incorporated in the laser cavity may be greater than or equal to two.

Methods for operating a tunable laser having integrated optical amplifiers are also described. According to some embodiments, a method of generating coherent light may comprise acts of reflecting light from a first reflector, and distributing the reflected light, with an N×M coupler, to N optical paths. The method may further include producing amplified light by amplifying light in at least two of the N optical paths, and returning the amplified light to the N×M coupler and first reflector. A method of operating a tunable laser may also include adjusting a phase of an optical signal in at least one of the N optical paths to adjust an output power from one of multiple power output ports of the tunable laser.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

The present technology pertains to tunable lasers that may be used in optical communication systems, among other applications. Aspects of the application include apparatus and methods to provide a tunable laser that includes a plurality of optical amplifiers in a parallel configuration and that can provide output power from multiple adjustable power ports. Additionally, the tunable laser is readily scalable to higher powers and additional power ports. According to another aspect of the application, methods of manufacturing a tunable laser of the types described herein are disclosed.

According to some embodiments, a tunable laser, such as tunable laser 200 described below in connection with FIG. 2, may be microfabricated and used in integrated optical systems, such as photonic integrated circuits (PICs). The PICs may be used in optical communication systems or optical coherent tomography systems, for example. In some cases, the tunable laser may be used for supplying an optical carrier wave and/or local oscillator to optical transmitters and receivers. In some embodiments, a tunable laser (such as tunable laser 200) may be fabricated in a fiber-optic system, e.g., as a tunable fiber laser. A tunable fiber laser may include a plurality of fiber amplifiers arranged in parallel and coupled into a laser cavity using fiber couplers.

The aspects and embodiments described above, as well as additional aspects and embodiments, are described further below. These aspects and/or embodiments may be used individually, all together, or in any combination of two or more, as the application is not limited in this respect.

Figure 1:
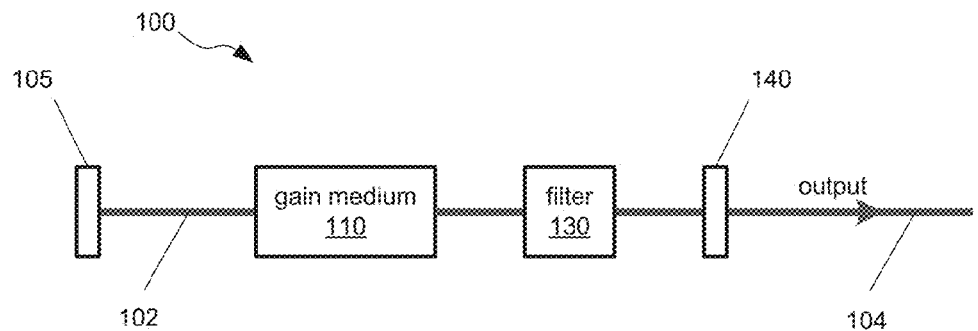
FIG. 1 depicts a conventional tunable laser cavity.
Figure 2:
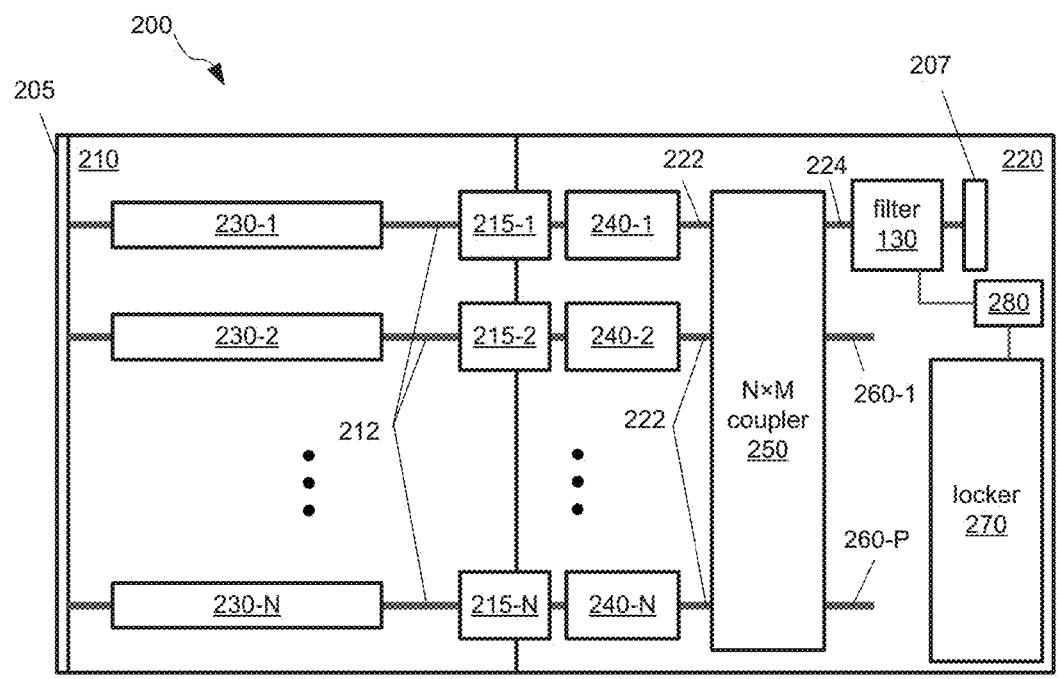
FIG. 2 depicts a tunable laser that includes N optical amplifiers arranged in parallel, according to some embodiments.

Referring to FIG. 2, a tunable laser 200 in accordance with an aspect of the present application may comprise an array of optical amplifiers 230-1, 230-2 ... 230-N (referred to collectively as 230 and individually as 230-$m$) that are coupled to an intracavity N×M optical coupler 250 and to a first cavity reflector 207 at a first end of the tunable laser cavity. The N optical amplifiers may be coupled to the N×M coupler through a plurality of optical paths 212 and 222. In some embodiments, the optical paths may comprise integrated photonic waveguides, e.g., fabricated from semiconductor and/or oxide material on a substrate. In some implementations, the optical paths 212 and/or 222 may comprise fiber-optic waveguides. A second end of the laser cavity may comprise a second reflector 205 arranged to reflect light back through the optical amplifiers 230. Additionally, the laser may include P output power ports 260-1 ... 260-P (referred to collectively as 260 and individually as 260-$m$). As described below, in some embodiments N and P are integers and P may be equal to or less than M−1.

Although FIG. 2 depicts N optical amplifiers coupled to N input ports of the N×M coupler, some embodiments may have fewer than N optical amplifiers. For example, some embodiments may have Q optical amplifiers coupled to a portion of the N input ports of the N×M coupler, where Q is fewer than N. An input port that does not have an optical amplifier coupled to it may be used as an intracavity power monitor in some embodiments.

The tunable laser 200 may further include a tunable wavelength filter 130 and at least one intracavity phase shifter. At least one laser cavity optical path 224 extending between the N×M coupler 250 and the first cavity reflector 207 may be provided, and may include the tunable wavelength filter 130. In some embodiments, the laser cavity optical path 224 may include a phase shifter. In the illustrated embodiment, a plurality of intracavity phase shifters 240-1, 240-2 ... 240-N are provided (referred to collectively as 240, and individually as 240-$m$), one corresponding to each of the optical amplifiers 230. The phase shifter(s) 240 may be located in the optical paths 222 connected to the N×M coupler 250. The wavelength filter 130 may be tuned to select a lasing wavelength that circulates in between the first cavity reflector 207 and second reflector 205, passing through the optical amplifiers 230. The phase shifter(s) 240 may be tuned to adjust an amount of output power delivered from one or more of the power ports 260-1 ... 260-P. The tuning (or adjusting) of the phase shifters may be dynamic (during operation of the laser) in some embodiments. Accordingly, a lasing wavelength for the tunable laser 200 may be selected by providing a control signal to the tunable wavelength filter 130. Additionally, power from one or more of the power ports may be adjusted while the laser is operating by providing one or more control signals to one or more of the phase shifters.

The tunable laser 200 may also include a wavelength locker 270. The wavelength locker 270 may comprise an integrated photonic circuit configured to sense an operating wavelength of the tunable laser. The wavelength locker 270 may comprise an interferometer, a Bragg grating structure, a resonator, or a combination thereof, and may produce a signal detected by wavelength locking circuitry 280 that is indicative of a lasing wavelength for the tunable laser. An output from the wavelength locking circuitry 280 may be provided to the intracavity tunable wavelength filter 130, so as to stabilize an operating wavelength of the tunable laser. In some embodiments, a wavelength locker 270 may be fabricated from a material having a low thermo-optic coefficient. In some cases, the wavelength locker and/or at least a portion of the chip or chips on which the tunable laser is fabricated may be temperature controlled using a thermo-electric cooler or heater.

In operation, the tunable laser 200 may produce laser light that reflects from the first cavity reflector 207, passes through the N×M coupler 250 where it is distributed to, and amplified by, the N optical amplifiers 230, and then proceeds to the second reflector 205 where it is reflected back through the amplifiers and laser cavity. As the light circulates back and forth in the laser cavity, each of the N optical amplifiers 230 contributes gain to the intracavity laser power. Additionally, a portion of the intracavity power is tapped out of the cavity through the P output power ports 260. In various embodiments, N, M, and P are integers. N may be greater than or equal to, 2. M may be less than, equal to, or greater than N. P may be less than, or equal to M. In some embodiments, N=M, and P=N−1.

Providing an array of optical amplifiers 230 in parallel, rather than just one larger amplifier in a laser cavity, improves thermal and optical performance of the tunable laser 200. The array spreads heat generated by the amplifiers 230 over a larger area, where it can be dissipated more easily. For example, an injection current to drive the amplifiers to obtain a given amount of power is spread over N separate regions of a substrate rather than being concentrated in a single region. An array of optical amplifiers also permits higher optical saturation power in the laser. In a semiconductor optical amplifier, the amount of available carriers per unit volume for optical gain may have an upper limit. Having multiple amplifiers in parallel increases the amplifier volume, while maintaining optical single-mode operation in each amplifier, and therefore increases the amount of available carriers for optical gain.

According to some embodiments, the optical amplifiers 230 may be located on a first semiconductor chip 210. The N×M coupler 250 and tunable filter 130 may be located on a second semiconductor chip 220. The phase shifters 240 may be located on the first or the second semiconductor chip. The first semiconductor chip 210 may comprise any suitable first semiconductor material, e.g., indium phosphide and/or any of its alloys (collectively referred to as indium phosphide), gallium arsenide and/or any of its alloys, or gallium nitride and/or any of its alloys. The material of the first semiconductor chip 210 may be different from a second semiconductor material of the second semiconductor chip 220. For example, the second semiconductor chip 220 may comprise silicon, silicon dioxide, silicon oxynitride, and/or silicon nitride, and include integrated silicon photonic devices.

When a tunable laser, such as tunable laser 200, is distributed across two semiconductor chips, mode-size adapters may be formed at the junction of the optical paths between the two semiconductor chips. For example, mode-size adapters may be formed at the ends of integrated waveguides running to the edge of a chip. In the example of FIG. 2, mode size adapters 215-1, 215-2 . . . 215-N are provided (collectively referred to herein as 215), one for each of the optical paths 212. The mode-size adapters may improve coupling efficiency of optical radiation from an optical path (e.g., a waveguide) 212 on the first semiconductor chip 210 to an optical path (e.g., a waveguide) 222 on the second semiconductor chip 222.

Figure 3A:
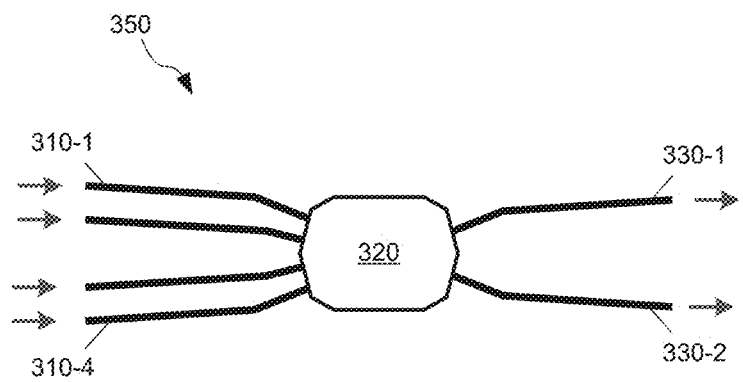
FIG. 3A depicts an N×M coupler, according to some embodiments.

One example of an optical N×M coupler 350 which may be used as the N×M coupler 250 of FIG. 2 is depicted in FIG. 3A, although the various aspects of the present application are not limited to only this type of coupler. In some implementations, an optical coupler may comprise a multi-mode interference (MMI) coupler or a star coupler. An optical coupler may comprise N first ports on one side of a coupling region 320 and M second ports on a second side of the coupling region. In the illustrated example, N equals four, such that first ports 310-1 . . . 310-4 (collectively referred to as 310) are provided, while M equals two such that second ports 330-1 and 330-2 (collectively referred to as 330 and individually as 330-$m$) are provided. It should be appreciated that other numbers of ports may be provided. In some embodiments, the coupling region 320 may comprise an integrated slab waveguide in which optical modes entering from the N first ports 310 expand and interfere optically before exiting through the M second ports 330. In some implementations, an optical coupler 350 may be formed as an integrated silicon optical device wherein the N and M ports and coupling region 320 are fabricated as silicon waveguide structures. The N and M ports may comprise single-mode optical waveguides each having transverse dimensions between approximately 50 nm and approximately 700 nm. In some embodiments, a single-mode waveguide may have a height between approximately 50 nm and approximately 300 nm and a width between approximately 200 nm and approximately 700 nm. The coupling region 320 may comprise a multimode slab waveguide, and have a same height as waveguides of the N and M ports. A width of the coupling region may be between approximately 1 micron and approximately 50 microns.

In other embodiments, an optical coupler 350 may be formed using any suitable semiconductor material, dielectric material, or material compositions. Material compositions may include metallic layers in some embodiments. Dielectric materials may include insulators such as oxides or nitrides. Optical couplers formed from other materials or material compositions may have different dimensions than those listed above.

For an optical coupler 350, the first ports 310 may be referred to as "input" ports, and the second ports 330 may be referred to as "output" ports. However, an N×M optical coupler may exhibit reciprocity and operate in both directions. For example, an optical coupler may distribute light received at N "input" ports among M "output" ports. The received light may have a distribution of N different intensities. The light distributed among the M output ports may have a distribution of M different intensities. The total of the output intensities may or may not be approximately equal to a total of the input intensities, depending on the design of the optical coupler. In some implementations, the direction of the light may be reversed, so that the optical coupler distributes light received at the M ports among the N ports having the same distribution of N different intensities. Although FIG. 3A depicts a 4×2 optical coupler, there may be any other number of first ports 310 and second ports 330.

Figure 3B:
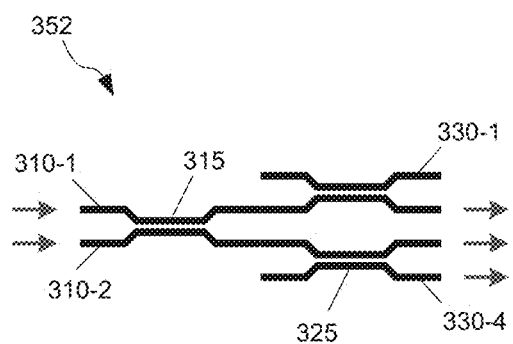
FIG. 3B depicts an N×M coupler, according to some embodiments.

Another example of an N×M optical coupler 352 is depicted in FIG. 3B. In the illustrated example N equals two such that first ports 310-1 and 310-2 are provided, and M equals four such that second ports 330-1 . . . 330-4 are provided. These numbers are merely examples. According to some embodiments, an optical coupler may comprise a plurality of single-mode optical waveguides that interact along their length. For example, two or more waveguides may run parallel and in close proximity to each other at coupling regions 315 and 325 (e.g., an optical directional coupler or an optical adiabatic coupler). The coupling regions may be regions where two or more waveguides are spaced near each other so that at least an evanescent field from one waveguide extends into at least one adjacent waveguide. As an optical mode travels along a waveguide, power will couple from one waveguide into at least one adjacent waveguide.

As noted above, one or more of the optical paths extending between the N×M optical coupler 250 and the N optical amplifiers 230 may include one or more phase shifters 240. In some implementations, there is one phase shifter in each optical path 222. A phase shifter 240-$m$ may be configured to adjust a phase of an optical signal traveling along the optical path 222, and to affect the optical interference of fields at the N×M coupler 250. By adjusting the phase of an optical signal in one or more optical paths 222, an amount of power emitted from the output power ports 260 and in the laser cavity optical path 224 can be altered. For example, adjusting a phase in one of the optical paths 222 can change the way in which the optical fields interfere at the N×M coupler 250 and deliver power to each of the M ports. As an example, according to one phase setting all of the intracavity power may flow through the laser cavity optical path 224. Another phase setting may distribute some of the intracavity power among the power ports 260.

For the phase shifters 240 to affect optical interference in the N×M coupler 250 consistently over a wide wavelength range, the optical path lengths between the N×M coupler and second reflector 205 through each optical amplifier may be approximately equal. In practice, the optical path lengths may differ, provided they do not differ by more than the temporal coherence length of the laser radiation. Having different optical path lengths may result in wavelength dependence, and may be used in some embodiments to provide optical wavelength filtering in the laser cavity. In some implementations, the phase shifters 240 may be adjusted by control signals that are varied manually and/or automatically. For example, each power port 260-$m$ may include an optical tap and a power detector, so that an operator can provide a control signal to adjust the phase shifters to obtain a desired power ratio from the power ports. Additionally or alternatively, feedback circuitry or any suitable control circuit may provide control signals to the phase shifters 240 responsive to detected power at one or more ports, so as to stabilize power from one or more ports 260. The feedback circuit may be any suitable circuit or may be implemented via digital signal processing. A feedback circuit may receive at least one power signal from a detector arranged to monitor a power from a power port, and provide a control signal to a phase shifter 240-$m$ to alter a phase responsive to the received power signal. The feedback circuit may compare the received power signal to a second signal to determine a value for the control signal.

Figure 4:
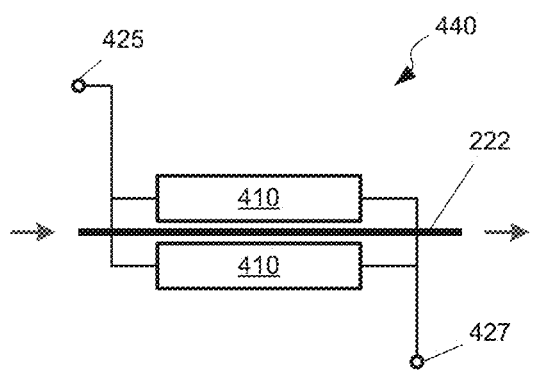
FIG. 4 depicts a thermo-optic phase shifter, according to some embodiments.

FIG. 4 depicts a non-limiting example of a phase shifter 440 that may be used in a tunable laser, for example as a phase shifter 240-$m$ of the tunable laser 200. According to some embodiments, the phase shifter 440 may be a thermo-optic phase shifter, as described by M. R. Watts et al., in "Adiabatic Thermo-Optic Mach-Zehnder Switch," *Opt. Lett.* Vol. 38, No. 5, 733-735 (2013), which is incorporated herein by reference. Such thermo-optic phase shifters can achieve efficient optical phase modulation of up to $2\pi$ in a length of waveguide less than 20 microns. In other embodiments, the phase shifter 440 may comprise a semiconductor-based phase shifter that alters phase by current injection into a waveguide. For an optical fiber implementation, the phase shifter may comprise piezoelectric material that stretches a length of fiber. Regardless of the type of phase shifter 440, it may be controlled by an electrical bias to adjust the phase of an optical signal traversing the optical path 222.

A thermo-optic phase shifter may include resistive elements 410 located adjacent an optical path (assumed to be a waveguide in this example) 222. In some embodiments, there may be just one resistive element 410 adjacent to the waveguide. A resistive element 410 may be located beside and/or above and/or below the optical waveguide. A resistive element may be formed of a resistive semiconductor material, metal, or any other suitable material that converts electrical current into heat. A thermo-optic phase shifter 440 may further include electrically conductive traces that extend to a first terminal 425 and a second terminal 427. The first and second terminals may be contact pads. Electrical current may be applied across the resistive element 410 via the first and second terminals. As current flows through the resistive element, the resistive element may dissipate heat that couples to at least a portion of the optical waveguide 222 and thereby change the refractive index within the optical waveguide. This change in refractive index can change the phase of an optical signal traveling through the waveguide 222. A thermo-optic phase shifter may extend along a waveguide over a distance between approximately 2 microns and approximately 400 microns, according to some embodiments. Other embodiments may include other lengths.

The various aspects described herein are not limited to thermo-optic phase shifters 440. In some implementations, a phase shifter 240-$m$ may comprise an electro-optic phase shifter. An electro-optic phase shifter may comprise a semiconductor junction (e.g., a p-n or p-i-n) formed in a portion of an integrated waveguide. The semiconductor junction may be configured to inject carriers into a region of the waveguide through which an optical mode travels. The injection of carriers increases optical absorption and can change the refractive index in the waveguide through Kramers-Kronig relations applied to the optical absorption. An electro-optic phase shifter may extend along a waveguide over a distance between approximately 50 microns and approximately 800 microns, according to some embodiments. Other embodiments may include other lengths.

Figure 5:
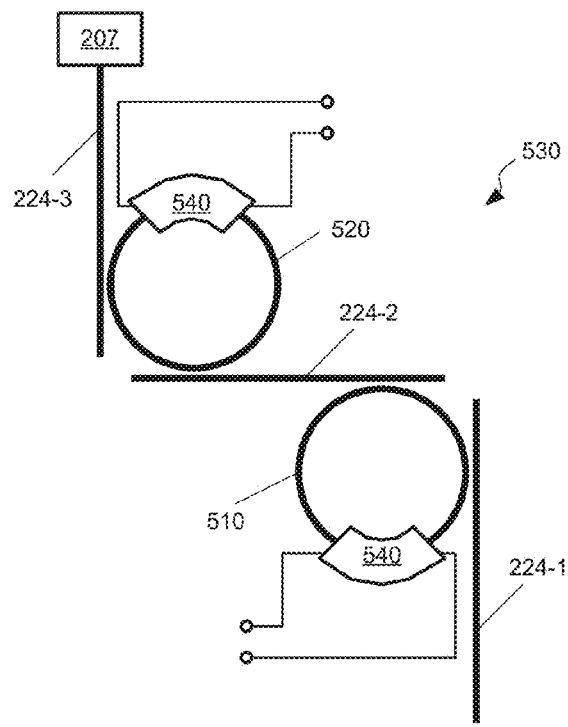
FIG. 5 depicts a tunable wavelength filter, according to some embodiments.

FIG. 5 depicts a tunable wavelength filter 530 that may be included in a high-power, tunable laser cavity, according to some embodiments. For example, the tunable wavelength filter 530 may serve as the tunable wavelength filter 130 of FIG. 2. The tunable wavelength filter 530 may include a pair of integrated photonic ring resonators 510, 520 located adjacent to a laser cavity optical path 224. The ring resonators 510, 520 may be circular, elliptical, or have a race track pattern, and may be of different sizes. Each ring resonator may have a free spectral range that can be adjusted thermo-optically through resistive heating elements 540. By adjusting the free spectral range of each ring resonator, it is possible to select a wavelength of an optical signal that can couple to the first ring resonator 510 from the laser cavity optical waveguide 224-1, couple to an intermediate waveguide 224-2, couple to the second ring resonator 520, and couple to an end waveguide 224-3, where the optical signal travels to and reflects from the laser cavity reflector 207.

The ring resonators 510, 520 may be formed as integrated optical waveguides, according to some embodiments. The ring resonator waveguides may have a transverse profile approximately the same as a transverse profile of the cavity optical waveguide 224-1, and described above. In some embodiments, the ring resonator waveguides may be formed from a same material as the cavity optical waveguide 224-1 (e.g., silicon).

Figure 6A:
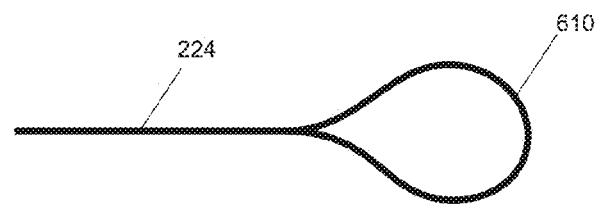
FIG. 6A depicts a waveguide loop mirror, according to some embodiments.

According to some embodiments, the first laser cavity reflector 207 may comprise any suitable reflector that can be integrated on a PIC. One example of a reflector is illustrated in FIG. 6A. According to this embodiment, a reflector may comprise a waveguide loop mirror. For example, an end of the cavity optical path (e.g., waveguide) 224 may extend into a loop 610 at an end of the laser cavity that circles back on the cavity optical waveguide. In some embodiments, the loop 610 may comprise a single mode waveguide, having a same transverse profile and formed of the same materials as the cavity optical waveguide 224. The loop may extend in any suitable shape, e.g., a teardrop shape.

Figure 6B:
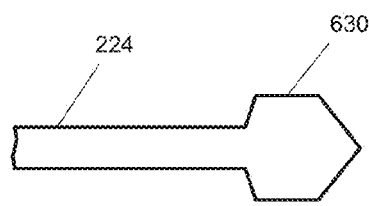
FIG. 6B depicts a waveguide mirror, according to some embodiments.

Another example of a reflector 207 that can be implemented at an end of a waveguide on a chip is depicted in FIG. 6B. According to this embodiment, a reflector may comprise a multi-mode interference reflector having an expanded region 630 of a waveguide 224. The expanded region 630 may comprise a slab waveguide region or optical cavity into which an optical mode traveling along the waveguide 224 may expand, optically interfere, and reflect back into the waveguide 224.

According to some embodiments, a second reflector 205 at an opposite end of the laser cavity may be implemented as a reflective coating deposited on facets on optical waveguides 212. For example, the first semiconductor chip may be cleaved or cut, exposing facets of the waveguides 212 that pass through the optical amplifiers. A reflective coating may then be deposited on the exposed facets. The reflective coating may comprise a multi-layer dielectric coating having high reflectivity at the lasing wavelength. In other embodiments, a plurality of second reflectors may be used. For example, each waveguide 212 may include a loop mirror or multi-mode interference reflector, so that the second reflector 205 comprises an array of reflectors.

Figure 7A:
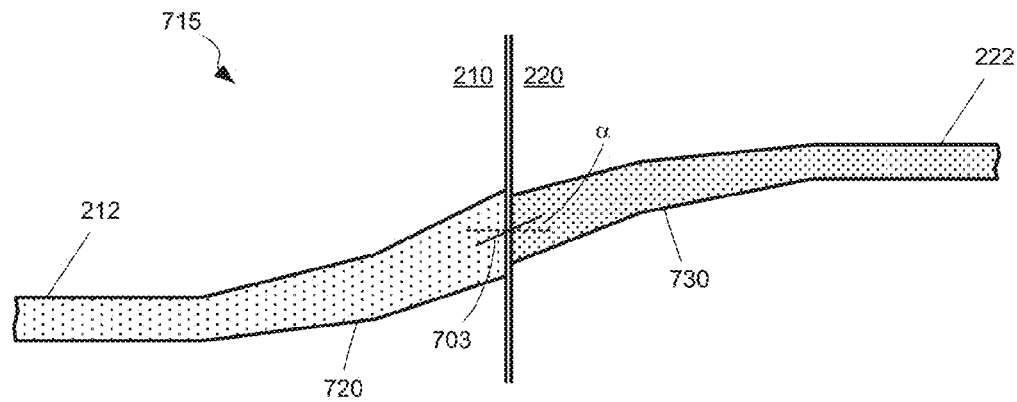
FIG. 7A depicts butt-coupled waveguides with mode size adapting regions, according to some embodiments.
Figure 7B:
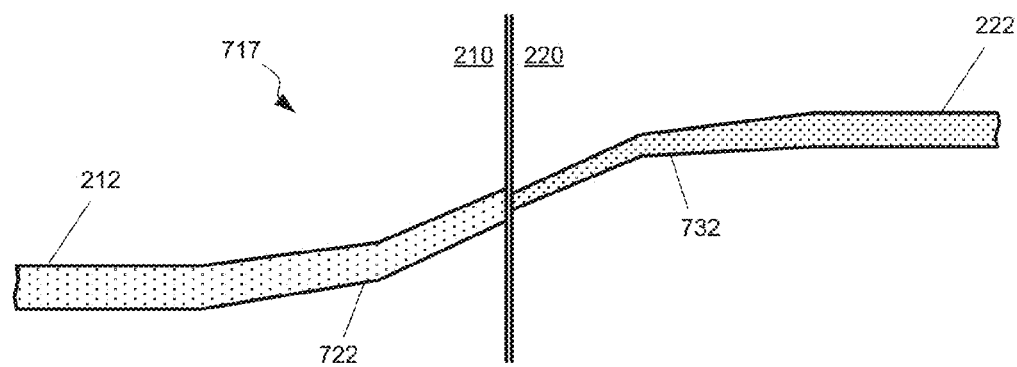
FIG. 7B depicts butt-coupled waveguides with mode size adapting regions, according to some embodiments.

As illustrated in FIG. 2, the optical amplifiers 230 may be located on a first semiconductor chip 210 and the N×M coupler 250 may be located on a second semiconductor chip 220. The optical amplifiers 230 may connect to the N×M coupler through N optical paths 212, 222 that comprise integrated optical waveguides. The integrated waveguides may, in some implementations, be butt-coupled to one another at edges of the semiconductor chips, as depicted in FIG. 7A and FIG. 7B. Such butt-coupled waveguides can provide efficient transfer of power from one waveguide 212 on one chip to another waveguide 222 on an adjacent chip. Where the waveguides meet at the edge of the chip, there may be mode-size adapters 215. One example of a mode-size adapter 715 is depicted in FIG. 7A.

In some implementations, a mode-size adapter 715 may comprise a portion of an integrated optical waveguide that changes in structure as it approaches the edge of a semiconductor chip or a region where optical coupling to another waveguide will take place. For example, a waveguide 212 for an optical amplifier 230-1 may expand gradually in size and/or curve at a mode-size adapting region 720 near an edge of the first semiconductor chip 210. The expansion in size may increase a transverse dimension of a waveguide up to 2 microns or more, in some cases. The expansion may allow the optical mode in the waveguide to expand in a direction transverse to the waveguide near the edge of chip, and thereby make coupling of the optical mode from one waveguide on the first chip to a second waveguide 222 on the second semiconductor chip 220 less sensitive to misalignment between the waveguides.

Mode-size adapting regions 720, 730 of each waveguide may follow any suitable curved path, such that an optical mode travelling along an optical axis 703 in the first adapting region 720 and exiting the first semiconductor chip 210 is aligned with an optical axis of the second adapting region 730 and makes an angle α with respect to a normal of a facet of each waveguide at the chip edges. The angle α may be between approximately 5° and approximately 40°, according to some embodiments. Butt-coupling using such angled optical axes can reduce deleterious effects of potential reflections from the chip edges. For example, potential reflections from the chip edge may reflect into a direction that is not readily coupled back into the optical waveguide 212. The reflected light may be in a direction that is outside the numerical aperture of the waveguide, and therefore is not captured and guided by waveguide 212. An optical adhesive or index-matching adhesive may be used in some cases to bond the butt-coupled waveguides. In some implementations, the optical axes of the butt-coupled waveguides may be normal to the chip edges, and optical adhesive or index-matching adhesive may be used to bond the butt-coupled waveguides. According to some embodiments, an anti-reflection coating (e.g., a multi-layer dielectric stack) may be formed on facets of but-coupled waveguides to reduce interface reflections (e.g., when going from an InP chip in which the cladding may comprise InP to a Si chip in which the cladding may comprise an oxide).

Another example of a mode-size adapter 717 is depicted in FIG. 7B. In some embodiments, the optical waveguides may taper and reduce in lateral and/or vertical dimensions in the mode-size adapting regions 722, 732 at edges of the respective chips. In some implementations, a transverse dimension of a waveguide may reduce to about 50 nm. By reducing a transverse dimension of an optical waveguide, an optical mode within the waveguide is confined less strongly and expands out into the surrounding dielectric or air as the waveguide becomes smaller. This can increase the lateral dimension of an optical mode traveling along the waveguide as it approaches the edge of the semiconductor chip.

According to some embodiments and referring again to FIG. 2, the optical amplifiers 230 may comprise any suitable type of optical amplifier. In a fiber-optic system, an optical amplifier may comprise an erbium-doped fiber, for example. When implemented in a PIC, an optical amplifier may comprise a semiconductor optical amplifier (SOA). In some embodiments, an SOA 800 may have a structure as depicted in the elevation view of FIG. 8. For example, an SOA may be formed on a semiconductor substrate 805, which may be a silicon (Si) substrate or an indium phosphide (InP) substrate, though other semiconductor substrates may be used in other embodiments. There may, or may not be, a dielectric or insulating layer 810 (e.g., an oxide or nitride layer) on the substrate. For example, the substrate may comprise a semiconductor on insulator (SOI) substrate, according to some embodiments. The insulation layer 810 may be between approximately 50 nm thick and approximately 4 microns thick.

In some implementations, a semiconductor optical amplifier 800 may comprise InP material and include a first n-doped InP base layer 820 formed on the substrate. The base layer 820 may be between 100 nm thick and approximately 2 microns thick. A buffer layer 825 comprising n-doped InP may be formed on the base layer 820. The buffer layer 825 may be formed by epitaxial growth or ion implantation, according to some embodiments, and may be between approximately 5 nm and approximately 50 nm thick. An intrinsic layer 830 of InP may be subsequently grown epitaxially on the buffer layer. The intrinsic layer 830 may be between approximately 50 nm and approximately 200 nm thick, according to some embodiments. A p-doped layer 840 may be formed on the intrinsic layer to form a p-i-n junction. The intrinsic layer 830 and p-doped layer 840 may be epitaxially grown. The SOA 800 may additionally include electron-blocking and hole-blocking layers (not shown) in some embodiments. A first electrical contact (not shown) may be formed on the p-doped layer 840, and a second electrical contact may connect to the base layer 820 so that a current can be applied across the p-i-n junction.

Figure 8:
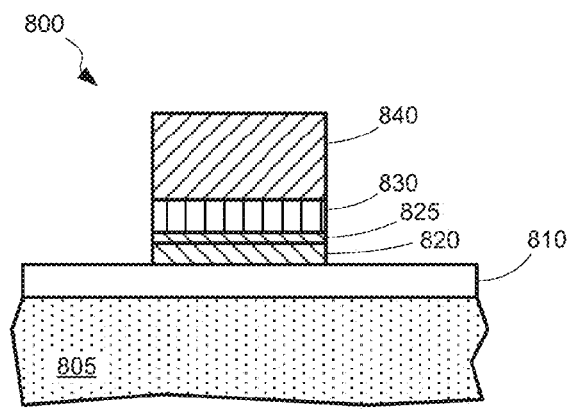
FIG. 8 depicts a semiconductor optical amplifier, according to some embodiments.

According to some implementations, a SOA, such as SOA 800, may be patterned in a waveguide structure. A cross-section of the waveguide structure may have a profile as depicted in FIG. 8. An optical mode may be confined to the waveguide and pass primarily through the intrinsic region 830 of waveguide where carrier recombination and optical amplification can occur. Although FIG. 8 depicts a ridge waveguide, some embodiments may include a buried waveguide (e.g., a waveguide comprising semiconductor material surrounded on two or more sides by a dielectric having a lower refractive index).

Although a semiconductor optical amplifier is described as being indium-phosphide based (which includes alloys of InP) in connection with FIG. 8, other materials may be used in other embodiments for a SOA. For example, a SOA may comprise gallium arsenide and/or its alloys. In some implementations, a SOA may comprise gallium nitride and/or its alloys. In some embodiments, a SOA may comprise alloys of indium-aluminum.

Figure 9:
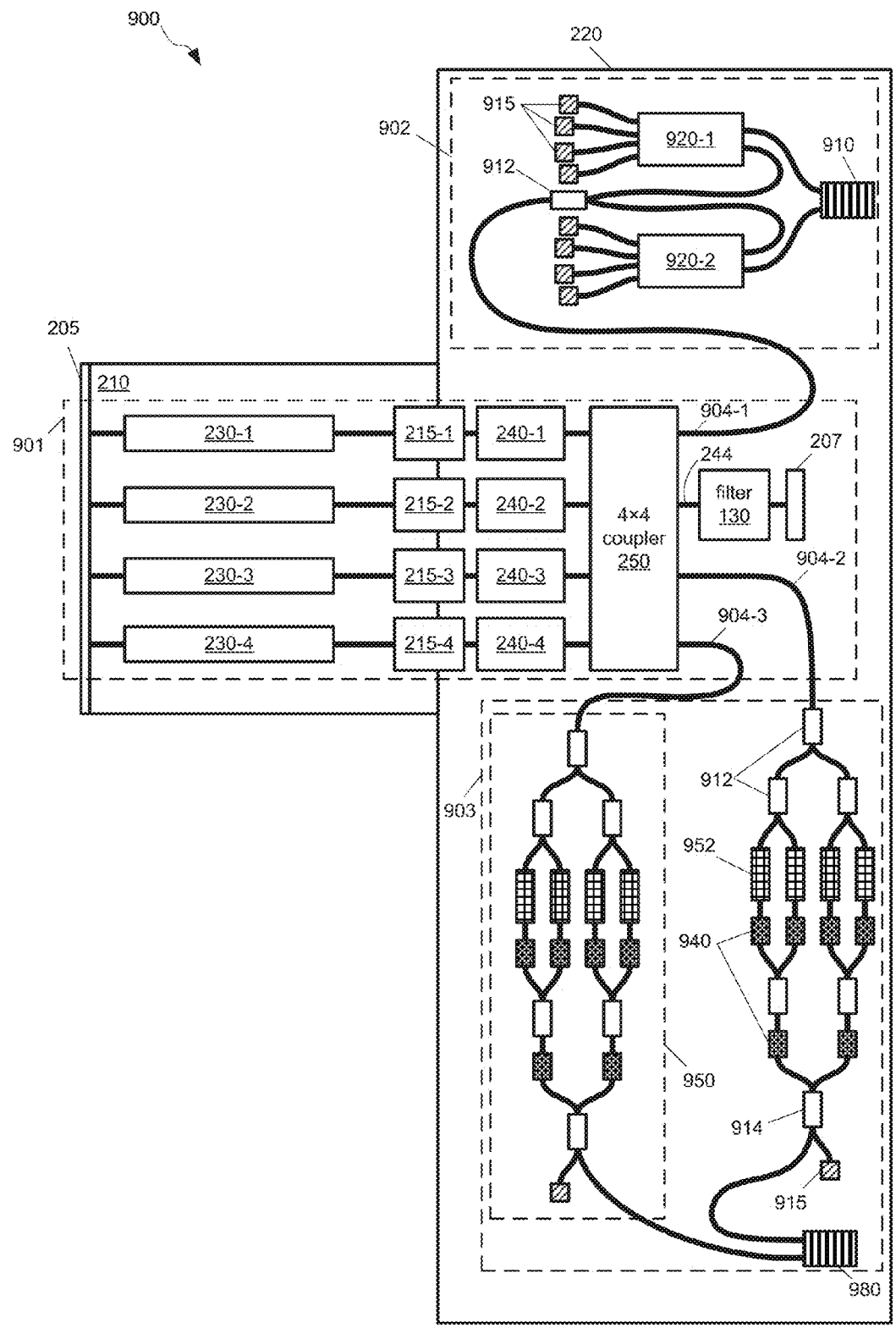
FIG. 9 depicts a tunable laser that includes N optical amplifiers coupled to a coherent optical receiver and optical transmitter, according to some embodiments.

According to some embodiments, a tunable laser that includes a plurality of optical amplifiers may be implemented in a PIC for optical communications, as depicted in FIG. 9. A PIC 900 may comprise the tunable laser 901 that includes, for example, a 4×4 optical coupler 250, four SOAs 230-1, 230-2, 230-3, and 230-4, four mode size adapters 215-1, 215-2, 215-3, and 215-4, and four phase shifters 240-1, 240-2, 240-3, and 240-4. The tunable laser 901 may include three power output ports 904-1-904-3 in addition to a laser cavity path 244 that directs intracavity power to a tunable wavelength filter 130 and a reflector 207. The laser cavity path 244 may be the same in nature as the previously described path 224. Laser light from a first power port 904-1 may couple to a coherent receiver 902. This laser light may provide a local oscillator signal for the coherent receiver. Laser light generated by the tunable laser 901 may also be provided through two other power ports 904-2, 904-3 to an optical transmitter 903.

The coherent receiver 902 may be formed on a same semiconductor chip 220 as a portion of the tunable laser 901, or may be formed on a different semiconductor chip. In some embodiments, a coherent optical receiver may include an optical surface coupler 910 that is configured to receive signal light, on which information is encoded, from an optical fiber and couple the signal light into integrated optical waveguides of the coherent receiver 902. The coherent receiver may further include one or more integrated coherent receiver photonic circuits 920-1, 920-2 that process the received signal light and produce a plurality of electrical signals that can be detected through contact pads 915. A local oscillator signal provided from the tunable laser 901 may be split with an optical splitter 912 to provide a local oscillator signal for each of the integrated coherent receiver circuits 920-1, 920-2. The integrated coherent receiver circuits 920-1, 920-2 may include phase-diverse and polarization-diverse photonic circuits.

The optical transmitter 903 may comprise a pair of nested Mach-Zehnder interferometers 950. A nested Mach-Zehnder interferometer may include a plurality of optical splitters 912 and a plurality of thermo-optic phase shifters 940. A nested Mach-Zehnder interferometer may also include high-speed electro-optic phase modulators 952. The nested Mach-Zehnder interferometers may be used for quadrature signal modulation and/or dual polarization modulation of optical signals. An optical transmitter 903 may further include an output surface coupler 980 that is configured to couple optical radiation from one or more waveguides to an optical fiber.

According to some embodiments, a nested Mach-Zehnder interferometer 950 may also include a 2×2 optical coupler 914 from which one exit port may provide an optical reference signal to an on-chip photodetector. The photodetector may convert the optical reference signal to an electrical signal that can be detected at a signal pad 915. The electrical signal can be monitored to determine relative powers from the two nested Mach-Zehnder interferometers 950.

Figure 10A:
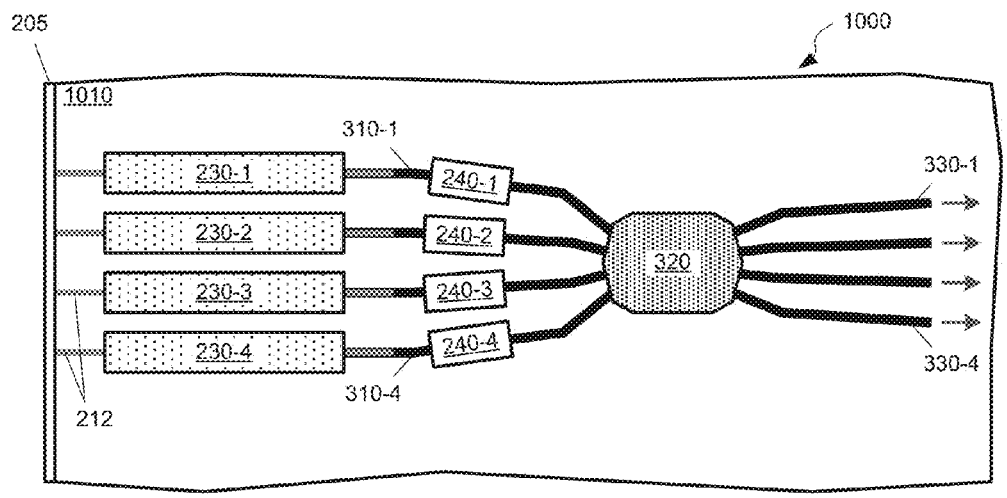
FIG. 10A and FIG. 10B depict an alternate embodiment for coupling N optical amplifiers to N ports of an N×M coupler in a tunable laser cavity.
Figure 10B:
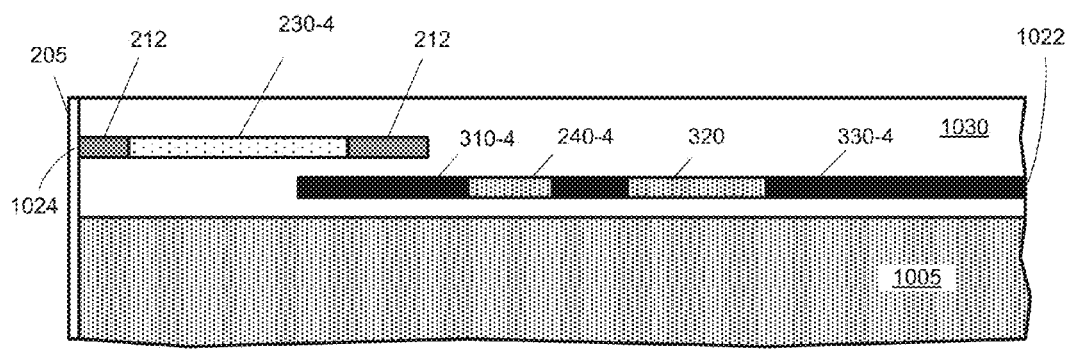

Although a tunable laser has been described as having a portion including optical amplifiers formed on a first semiconductor chip 210 and a second portion formed on a second semiconductor chip 220, in some implementations a tunable laser may be formed on a single semiconductor chip, as depicted in FIG. 10A for tunable laser 1000 on chip 1010. An elevation view of the structure shown in FIG. 10B. For example, an N×M optical coupler 320 and integrated optical waveguides 310-1 ... 310-4, 330-1 ... 330-4 may be formed in a first semiconductor layer 1022 on a substrate 1005. In some implementations, the first semiconductor layer may comprise a silicon semiconductor layer (e.g., a silicon-on-insulator layer). Additionally, the phase shifters 240-1 ... 240-4 for one or more of the N input ports to the coupler 320 may be formed on the first semiconductor layer 1022. A second layer 1024 of semiconductor material, for example InP may be formed over the first semiconductor layer 1022 as depicted in FIG. 10B. According to some embodiments, the second layer of semiconductor material may be formed by a bonding process. For example, a wafer bonding and etch-back process may be employed as described in U.S. Pat. No. 9,020,001, which is incorporated herein by reference.

Semiconductor optical amplifiers 230 and their respective waveguides 212 may be formed in the second semiconductor layer 1024. In some embodiments, an insulating dielectric, for example an oxide, 1030 may be deposited between the layers. An insulating layer may also be deposited as an overlayer to passivate the device. Power from the semiconductor optical amplifiers 230 on the second layer may couple to the lower ports (e.g., silicon waveguides) 310 by evanescent coupling. In this manner, the power in the laser cavity can travel from one cavity reflector 205 through the semiconductor optical amplifiers, into the underlying silicon waveguides, and through the N×M optical coupler 320 to another cavity mirror 207 (not shown) coupled to one port 330-m of the optical coupler 320.

Figure 11A:
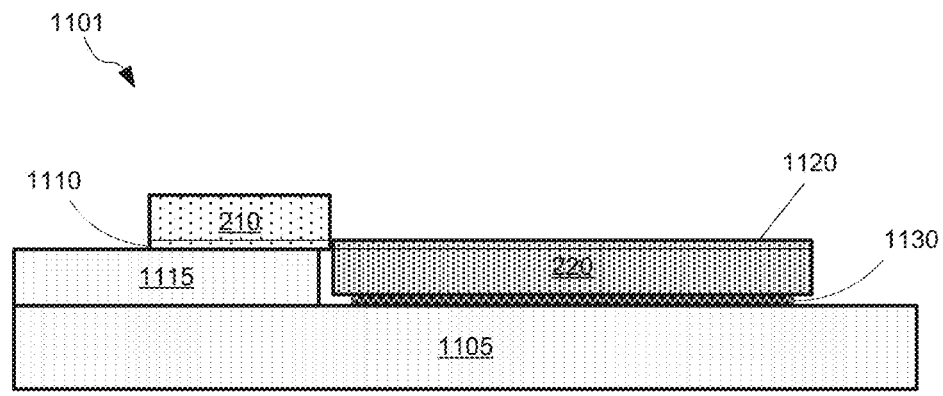
FIG. 11A depicts an embodiment of a coupled optical amplifier chip and silicon photonics chip in which a laser cavity is distributed between the two chips.
Figure 11B:
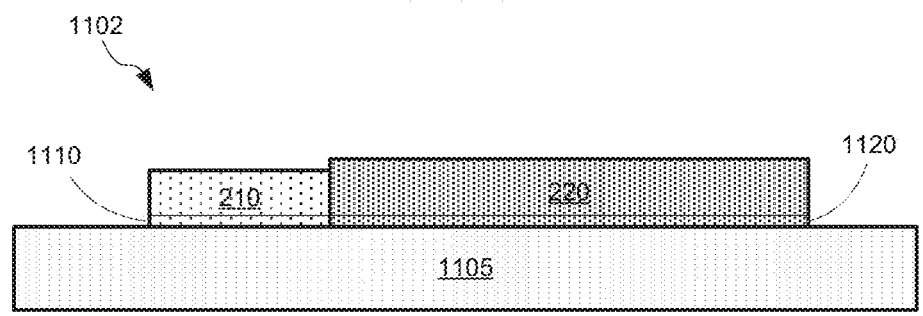
FIG. 11B depicts an embodiment of a coupled optical amplifier chip and silicon photonics chip in which a laser cavity is distributed between the two chips.
Figure 11C:
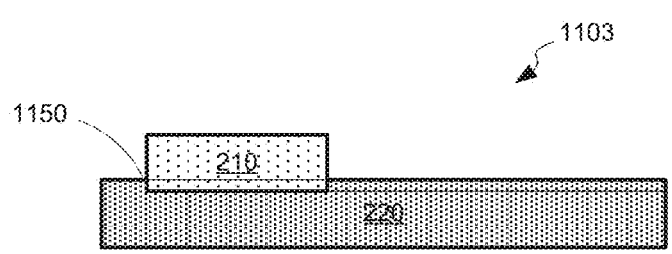
FIG. 11C depicts an embodiment of a coupled optical amplifier chip and silicon photonics chip in which a laser cavity is distributed between the two chips.

In some embodiments, it may be preferable to form the optical amplifiers 230 on a different substrate from other components of the tunable laser. FIGS. 11A-FIG. 11C depict embodiments in which the SOAs may be formed on a first substrate or semiconductor chip 210 and coupled to a second semiconductor chip 220 on which the N×M coupler, phase shifters, and tunable wavelength filter are located. In some implementations, the SOAs may be formed on a "process side" or "device side" 1110 of the first semiconductor chip 210. As shown in the configuration 1101 of FIG. 11A, the first chip may be flipped and bonded to a first sub-mount 1115. Such flip-chip bonding can improve heat dissipation from the SOAs. For example the sub-mount may comprise a material (e.g., aluminum nitride) having higher thermal conductivity than the material of the first semiconductor chip 210 (e.g., indium phosphide). The first sub-mount 1115 may be bonded to a base mount 1105. The second semiconductor chip 220 may then be aligned and bonded to the base mount. In some embodiments, the components on the second semiconductor chip 220 are formed on a process side 1120. In some embodiments, the second semiconductor chip 220 may be manipulated with a positioning device and its alignment to the first chip adjusted until a correct alignment is achieved. According to some embodiments, correct alignment may be detected by monitoring optical power transferred from one chip to the other. In some cases, a magnified image of the chip interface may be viewed or processed to determine correct alignment. The magnified image may be obtained through a combination of optical and electronic magnification using optical lenses and CCD or CMOS imaging array. Once aligned, an epoxy or UV-curable adhesive 1130 may then be cured to affix the second semiconductor chip 220 and preserve the alignment. In some embodiments, a UV curable adhesive or optical adhesive may additionally be located between the first semiconductor chip 210 and the second semiconductor chip 220 to provide both adhesion and index matching between the optical paths (e.g., waveguides) 212, 222 on each chip.

According to some embodiments, both the first semiconductor chip 210 and the second semiconductor chip 220 may be flip-chip bonded to a base mount 1105, as depicted in configuration 1102 of FIG. 11 B. In some cases, one or both of the chips may be solder bonded (e.g., using bump bonds) to the base mount 1105. For example, the solder may be heated before bonding, the chips aligned, and then the solder may be cooled to bond the chips and preserve the alignment. In some embodiments, a UV-curable or optical adhesive may be used additionally between the chips and/or between the chips and base mount 1105 to aid in permanently fixing the chips after alignment has been achieved.

According to some implementations, the first semiconductor chip 210 containing the SOAs may be flip-chip bonded to the second semiconductor chip 220, as depicted in configuration 1103 of FIG. 11C. According to this embodiment, the second semiconductor chip 220 may include a trench 1150 or other receiving feature to receive the first semiconductor chip 210. For example, the trench may have a depth between approximately 500 nm and approximately 10 microns, such that optical paths (e.g., waveguides) 212, 222 on the two chips become essentially coplanar when the chips are bonded together. The chips may be aligned and bonded using solder bonding and/or adhesive bonding as described above.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. A laser having a laser cavity comprising:
   a first reflector at a first end of the laser cavity;
   an intracavity N×M coupler arranged to receive light from the first reflector at a first port and distribute the light to N output ports, where N and M are both greater than 1;
   Q optical amplifiers arranged to amplify light from at least some of the N output ports to produce amplified light, where Q≥2; and
   at least one second reflector arranged to reflect the amplified light back to the N×M coupler, wherein the first reflector is located on a first photonic integrated circuit chip that includes a coherent optical receiver and an optical modulator arranged to receive power from the laser and the at least one second reflector is located on a second chip.

2. The laser of claim 1, further comprising at least one phase shifter in at least one optical path between the N×M coupler and the Q optical amplifiers.

3. The laser of claim 2, wherein the at least one phase shifter comprises at least one thermo-optic phase shifter.

4. The laser of claim 2, further comprising M−1 power ports connected to the N×M coupler, wherein the at least one phase shifter is adjustable to alter an amount of laser power from at least one of the M−1 power ports.

5. The laser of claim 4, further comprising:
   a detector arranged to sense an optical power from one of the M−1 power ports; and
   a feedback circuit arranged to receive a power signal from the detector and alter a phase of a phase shifter responsive to the received power signal.

6. The laser of claim 1, further comprising a tunable wavelength filter in the laser cavity and coupled to the N×M coupler.

7. The laser of claim 6, wherein the tunable wavelength filter comprises at least one ring resonator coupled to a waveguide.

8. The laser of claim 6, wherein the tunable wavelength filter is configured to tune a wavelength of the laser over a range of wavelengths, the range of wavelengths lying between 1200 nm and 1700 nm.

9. The laser of claim 1, wherein the N×M coupler is integrated on the first photonic integrated circuit chip and the Q optical amplifiers are integrated on the second chip.

10. The laser of claim 9, further comprising:
    first microfabricated waveguides on the first photonic integrated circuit chip and second microfabricated waveguides on the second chip arranged to couple the N output ports of the N×M coupler to the Q optical amplifiers; and
    mode-size adapters located between the first microfabricated waveguides and the second microfabricated waveguides.

11. The laser of claim 10, wherein the first microfabricated waveguides are butt-coupled to the second microfabricated waveguides.

12. The laser of claim 9, wherein the first photonic integrated circuit chip comprises a silicon photonics chip and the second chip comprises indium-phosphide.

13. The laser of claim 12, further comprising:
    M−1 power ports connected to the N×M coupler,
    wherein a first of the M−1 power ports is connected to the coherent receiver, and
    wherein a second of the M−1 power ports is connected to the optical modulator.

14. A method of generating coherent light, the method comprising:
    reflecting light from a first reflector located on a first photonic integrated circuit chip;

distributing the light, with an N×M coupler, to N optical paths, where N and M are both greater than 1;

producing amplified light by amplifying light in at least some of the N optical paths with Q optical amplifiers, where Q ≥2;

returning the amplified light to the N×M coupler and first reflector with at least one second reflector located on a second chip;

receiving power from the N×M coupler at a coherent optical receiver located on the first photonic integrated circuit chip; and receiving power from the N×M coupler at an optical modulator located on the first photonic integrated circuit chip.

15. The method of claim 14, wherein producing amplified light by amplifying light in at least some of the N optical paths comprises amplifying the light with indium-phosphide semiconductor optical amplifiers.

16. The method of claim 14, wherein returning the amplified light comprises returning the amplified light from a first semiconductor material to a second semiconductor material in which the N×M coupler is fabricated, wherein the first semiconductor material is different from the second semiconductor material.

17. The method of claim 16, wherein the first semiconductor material comprises indium phosphide and the second semiconductor material comprises silicon.

18. The method of claim 14, further comprising adjusting a tunable filter to select a wavelength of the light reflected from the first reflector, wherein the wavelength is between approximately 1200 nm and approximately 1700 nm.

19. The method of claim 14, further comprising:
providing portions of the coherent light out M−1 power ports connected to the N×M coupler; and
adjusting a phase of light in at least one of the N optical paths to alter an amount of power in at least one of the M−1 power ports.

20. The method of claim 19, further comprising:
providing a first signal from a first power port of the M−1 power ports to the coherent optical receiver; and
providing a second signal from a second power port of the M−1 power ports to the optical modulator, wherein the N×M coupler is located on the first photonic integrated circuit chip.

21. The method of claim 20, further comprising:
mixing the first signal as a local oscillator with a received optical signal; and
modulating the second signal as a carrier wave to encode at least a portion of a transmitted optical signal.

* * * * *